(12) United States Patent
Nagamine et al.

(10) Patent No.: US 9,346,084 B2
(45) Date of Patent: May 24, 2016

(54) LIQUID PROCESSING APPARATUS AND LIQUID PROCESSING METHOD

(71) Applicant: Tokyo Electron Limited, Tokyo (JP)

(72) Inventors: Shuichi Nagamine, Kumamoto (JP); Yusuke Hashimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 752 days.

(21) Appl. No.: 13/680,426

(22) Filed: Nov. 19, 2012

(65) Prior Publication Data
US 2013/0125931 A1 May 23, 2013

(30) Foreign Application Priority Data
Nov. 21, 2011 (JP) .................................. 2011-254269

(51) Int. Cl.
| | | |
|---|---|---|
| H01L 21/67 | (2006.01) | |
| B08B 3/10 | (2006.01) | |
| B08B 3/12 | (2006.01) | |

(52) U.S. Cl.
CPC ... B08B 3/10 (2013.01); B08B 3/12 (2013.01); H01L 21/67028 (2013.01)

(58) Field of Classification Search
CPC .................. H01L 21/68735; H01L 21/68764; H01L 21/67028; H01L 21/67034; B08B 3/10; B08B 3/12
See application file for complete search history.

(56) References Cited

U.S. PATENT DOCUMENTS

| | | | | |
|---|---|---|---|---|
| 2007/0240824 | A1* | 10/2007 | Kaneko | ............. H01L 21/67051 156/345.11 |
| 2010/0032097 | A1* | 2/2010 | Ohashi | ...................... 156/345.55 |

FOREIGN PATENT DOCUMENTS

| | | |
|---|---|---|
| JP | 11-087294 A | 3/1999 |
| JP | 2002-299213 A | 10/2002 |
| JP | 2006-073753 A | 3/2006 |
| JP | 2010-040818 A | 2/2010 |
| JP | 2010-149003 A | 7/2010 |

* cited by examiner

*Primary Examiner* — David Cormier
(74) *Attorney, Agent, or Firm* — Abelman, Frayne & Schwab

(57) ABSTRACT

Disclosed is a liquid processing apparatus capable of performing a liquid processing and a drying processing in a position each having a different height. The liquid processing apparatus includes: a substrate holding unit configured to hold a substrate; a rotation driving unit configured to rotate the substrate holding unit; a substrate holding unit elevating member configured to lift and lower the substrate holding unit; a processing liquid supply unit configured to supply a processing liquid to the substrate; a liquid receiving cup configured to surround the substrate when the processing liquid is being supplied to the substrate; a drying cup located above the substrate and the liquid receiving cup when the processing liquid is being supplied to the substrate. The drying cup surrounds the substrate and located above the liquid receiving cup when the substrate is being dried.

13 Claims, 7 Drawing Sheets

LIQUID PROCESSING APPARATUS AND LIQUID PROCESSING METHOD

CROSS-REFERENCE TO RELATED APPLICATIONS

This application is based on and claims priority from Japanese Patent Application No. 2011-254269, filed on Nov. 21, 2011, with the Japanese Patent Office, the disclosure of which is incorporated herein in its entirety by reference.

TECHNICAL FIELD

The present disclosure relates to a liquid processing apparatus and a liquid processing method for performing a liquid processing on a substrate such as, for example, a semiconductor wafer or a glass substrate for a flat panel display.

BACKGROUND

In manufacturing process of a semiconductor integrated circuit (IC) or flat panel display (FPD), a liquid processing is performed on a semiconductor wafer or a glass substrate for FPD, and after the liquid processing is completed, a drying processing is performed by rotating the substrate. See, for example, Japanese Patent Laid-Open Publication No. H11-87294.

SUMMARY

An exemplary embodiment of the present disclosure provides a liquid processing apparatus which includes: a substrate holding unit configured to hold a substrate; a rotation driving unit configured to rotate the substrate holding unit; a substrate holding unit elevating member configured to lift and lower the substrate holding unit; a processing liquid supply unit configured to supply a processing liquid to the substrate; a liquid receiving cup configured to surround the substrate when the processing liquid is being supplied to the substrate; a drying cup located above the substrate and the liquid receiving cup when the processing liquid is being supplied to the substrate, and configured to surround the substrate and be located above the liquid receiving cup when the substrate is being dried.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
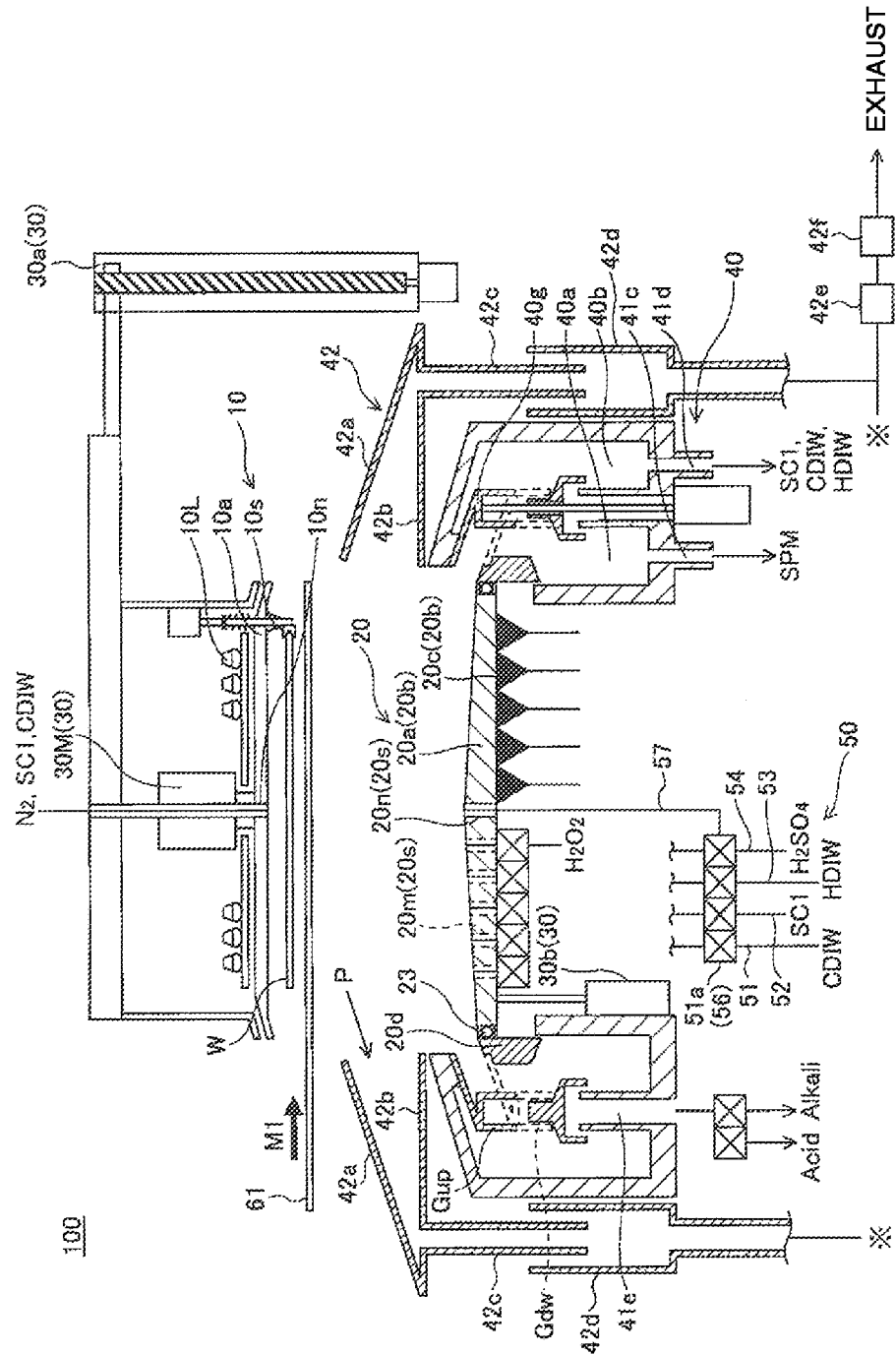
FIG. 1 is a view schematically illustrating a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Conventionally, the substrate is continuously rotated after the liquid processing is completed to shake off or scatter deionized water to dry the substrate in a state where the positional relationship of the substrate is maintained, or in a state where only the substrate is lifted to switch the position of a cup. In these cases, there is a possibility that the atmosphere including mist may be left behind around the substrate even after the liquid processing is completed and adhered to the substrate to become the cause of particles during the drying processing.

The present disclosure has been made in an effort to solve the problems described above and provides a substrate processing apparatus and a substrate processing method capable of performing a liquid processing and a drying processing at positions having different heights from each other.

A first exemplary embodiment of the present disclosure provides a liquid processing apparatus which includes: a substrate holding unit configured to hold a substrate; a rotation driving unit configured to rotate the substrate holding unit; a substrate holding unit elevating member configured to lift and lower the substrate holding unit; a processing liquid supply unit configured to supply a processing liquid to the substrate; a liquid receiving cup configured to surround the substrate when the processing liquid is being supplied to the substrate; a drying cup located above the substrate and the liquid receiving cup when the processing liquid is being supplied to the substrate, and configured to surround the substrate and be located above the liquid receiving cup when the substrate is being dried.

In the liquid processing apparatus, the drying cup is located at a higher position when the substrate is being dried than a position when the processing liquid is being supplied. The drying cup has a ring shape including an upper plate and a lower plate, and has an opening part which opens toward a center of the substrate.

In the liquid processing apparatus, the substrate holding unit and the drying cup are lifted synchronously.

The liquid processing apparatus further includes a drying cup elevating member configured to lift and lower the drying cup.

In the liquid processing apparatus, gas is supplied to a lower surface of the substrate while the substrate is being dried.

In the liquid processing apparatus, a gas flow path is provided between the drying cup and the liquid receiving cup for receiving gas outside of the drying cup.

In the liquid processing apparatus, the substrate holding unit is lifted while being rotated.

The liquid processing apparatus further includes a liquid storage unit in which liquid is stored and the substrate can be immersed into the liquid, and deionized water is stored when the substrate is being dried.

A second exemplary embodiment of the present disclosure provides a liquid processing method which includes: performing a liquid processing of a substrate while holding the substrate at a liquid processing position while holding the substrate; and performing a drying processing of the substrate subjected to the liquid processing at a drying position higher than the liquid processing position.

In the liquid processing process, the substrate located at the liquid processing position is surrounded by a liquid receiving cup that receives a processing liquid utilized in the liquid processing. In the drying processing, the substrate located at the drying position is rotated while being surrounded by a drying cup surrounding the substrate and having an opening part which opens toward the substrate.

In the liquid processing method, gas is supplied to a space between the liquid receiving cup and the drying cup.

The liquid processing method further includes a substrate lifting process of lifting the substrate from the liquid processing position to the drying position.

The liquid processing method further includes lifting the drying cup and the substrate from the liquid processing position to the drying position synchronously.

In the substrate lifting process, the substrate is lifted while being rotated.

In the drying processing, deionized water is stored in a storage disposed at a position lower than the drying position.

According to the liquid processing apparatus and liquid processing method of the present disclosure, the liquid processing and the drying processing are performed at different positions from each other so that after completion of the liquid processing fume such as steam or mist can be prevented from being adhered to the substrate and causing particles.

Hereinafter, a non-limited exemplary embodiment of the present disclosure will be described with reference to the accompanying drawings. In the drawings, the same or corresponding members are depicted by the same or corresponding reference numerals, and the duplicated descriptions thereof are omitted. Further, the drawings are not intended to represent a relative ratio between the members or components. Therefore, it is to be understood that the specific dimensions are determined by a person having an ordinary skill in the art in view of the non-limited embodiments to be described below.

First, a liquid processing apparatus according to an embodiment of the present disclosure will be described with reference to FIG. 1. In the present embodiment, a semiconductor wafer ("a wafer W") is used as a substrate to be processed.

As illustrated in FIG. 1, a liquid processing apparatus 100 includes a substrate supporting unit 10 that supports a wafer W, a storage tank 20 installed to be opposed to the lower surface of wafer W supported by substrate supporting unit 10, a driving unit 30 capable of changing the separation distance between substrate supporting unit 10 and storage tank 20, a liquid receiving cup unit 40 formed in a ring shape and installed at an outer peripheral side of storage tank 20 to surround storage tank 20, and a drying cup 42 formed in a ring shape and installed above liquid receiving cup unit 40. In liquid processing apparatus 100, wafer W is rotatably supported by substrate supporting unit 10, a liquid is supplied to be stored in storage tank 20, the separation distance between substrate supporting unit 10 and storage tank 20 is reduced by driving unit 30 to immerse wafer W in the liquid, so that a liquid processing is performed on the surface of wafer W. Further, in liquid processing apparatus 100, the liquids supplied to wafer W, discharged from storage tank 20, and scattered from the surface of wafer W due to the rotation of wafer W are recovered in liquid receiving cup unit 40. Still further, in liquid processing apparatus 100, substrate supporting unit 10 and drying cup 42 are lifted by driving mechanism 42g such that a drying processing is performed in a position different from a position where the liquid processing has been performed.

Substrate supporting unit 10 includes a top plate member 10a formed in a ring shape and a claw 10s holding wafer W below of top plate member 10a, a top plate nozzle 10n located at the center of top plate member 10a, and a heater 10L heating wafer W.

Top plate member 10a supports wafer W in a state where a surface (surface on which pattern is formed) of wafer W is oriented downwardly. For example, three claws 10s are disposed at an equal distance from one another in top plate member 10a. Top plate nozzle 10n supplies the liquid (including a processing liquid) to an upper surface of wafer W. Heater 10L heats wafer W to a predetermined temperature in order to uniformly maintain the temperature of the liquid present in the upper surface of the wafer W. Heater 10L may use, for example, an LED.

Storage tank 20 includes a bottom part 20b formed in a circular shape and installed to oppose the lower surface of wafer W supported by the supporting unit 10, a dam part 20d including a surrounding wall installed at an outer peripheral part of bottom part 20b to surround bottom part 20b, a supplying part 20s to supply liquid to storage tank 20, and a seal member 23 located at a sliding part of dam part 20d and bottom part 20b.

Bottom part 20b includes a base plate member 20a formed in a circular shape, an ultrasonic vibration plate 20c that applies vibration to wafer W. A surface of base plate member 20a opposing the lower surface of wafer W is formed in an inclined plane inclining downwardly in a direction from the center of base plate member 20a toward the outer peripheral part thereof. Ultrasonic vibration plate 20c vibrates liquid to physically clean the surface of wafer W contacted with the liquid.

Bottom part 20b is configured to move to change a relative positional relationship with dam part 20d, so that when an upper end position of bottom part 20b (base plate member 20a) is made lower than an upper end of dam part 20d, a tank (container) is formed by bottom part 20b and dam part 20d. Here, a method for changing the relative positional relationship between bottom part 20b and dam part 20d may include either a method in which one of bottom part 20b and dam part 20d is moved or both bottom part 20b and dam part 20d are moved.

Dam part 20d is formed in a cylindrical shape and installed at outer peripheral part of storage tank 20 to surround base plate member 20a. The surface of the upper end of dam part 20d is formed in an inclined plane inclining downwardly from the center of dam part 20d toward the outer peripheral part thereof.

Supplying part 20s includes a base plate nozzle 20n located at the center of base plate member 20a and a plurality of ejection ports 20m disposed in the direction from the center of base plate member 20a toward the outer peripheral part. Base plate nozzle 20n and the plurality of ejection ports 20m supply liquid to the lower surface of wafer W.

Seal member 23 secures a water tightness between the sliding part of dam part 20d and base plate member 20a in order to prevent the liquid stored in storage tank 20 from being leaked from a gap between bottom part 20b (base plate member 20a) and dam part 20d. An O-ring may be used for seal member 23.

Driving unit 30 includes a motor 30M that rotates top plate member 10a of substrate supporting unit 10, a substrate driving unit 30a that changes the separation distance between substrate supporting unit 10 (wafer W) and storage tank 20, and a bottom part driving unit 30b that moves bottom part 20b vertically. Further, substrate driving unit 30a and bottom part driving unit 30b of driving unit 30 may utilize any mechanism as long as the mechanism moves a unit to be driven to a desired position by a rotation movement or a rectilinear movement of a motor, cylinder or electromagnetic force.

Liquid receiving cup unit 40 includes a first receiving part 40a formed in a ring shape to discharge the liquid stored in storage tank 20, a second receiving part 40b formed in a ring shape and installed at more outer peripheral side than first receiving part 40a to recover the scattered liquid due to the centrifugal force among the liquid supplied to wafer W being rotated, a movable sectioning guide 40g that sections first receiving part 40a and second receiving part 40b. Further, liquid receiving cup unit 40 includes a liquid discharging port 41c that discharges the liquid introduced into first receiving part 40a, a liquid discharging port 41d that discharges the liquid introduced into second receiving part 40b, and a gas exhausting port 41e that exhausts atmospheric gas within liquid processing apparatus 100. Here, when sectioning guide 40g is located at an upper guide position (Gup) (a position depicted by the solid line in FIG. 1), liquid receiving cup unit 40 discharges the liquid to the liquid discharging port 41, and otherwise, when sectioning guide 40g is located at an lower guide position (Gdw) (a position depicted by the dotted line in FIG. 1), liquid receiving cup unit 40 discharges the liquid to liquid discharging port 41d.

Figure 2A:
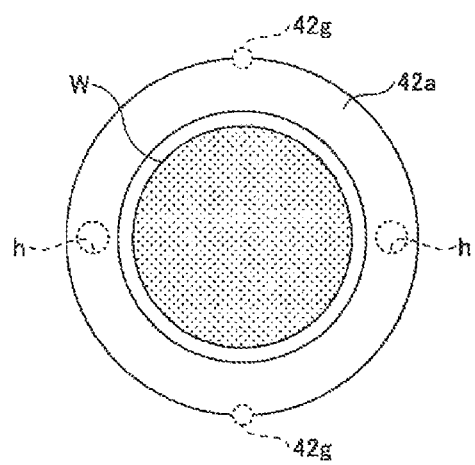
FIG. 2 is an explanatory view illustrating a drying cup of the liquid processing apparatus of FIG. 1.

Drying cup 42 is formed in a ring shape as illustrated in FIG. 2A. The inner diameter of drying cup 42 is larger than that of wafer W processed in liquid processing apparatus 100, and wafer W can be moved vertically within drying cup 42 by wafer supporting unit 10. Further, as illustrated in FIG. 1, drying cup 42 includes an upper plate 42a and a lower plate 42b. Upper plate 42a has an inclined plane inclined downwardly toward the outer peripheral part and connected to lower plate 42b at outer peripheral edge thereof. Therefore, drying cup 42 has an opening part P which opens toward the center of thereof. Still further, two openings h that exhaust gas within drying cup 42 are formed symmetrically with each other about the center of drying cup 42 in lower plate 42b as illustrated in FIG. 2A, and ducts 42c are connected to openings h as illustrated in FIG. 1. Opening h may exhaust gas contained within drying cup 42, and two or more openings h may be installed. The lower portion of duct 42c is inserted into an exhaust and discharge pipe 42d to be movable vertically. Exhaust and discharge pipe 42d is connected to an exhaust apparatus (not illustrated) through a damper 42e and a gas-liquid separator 42f.

Figure 2B:
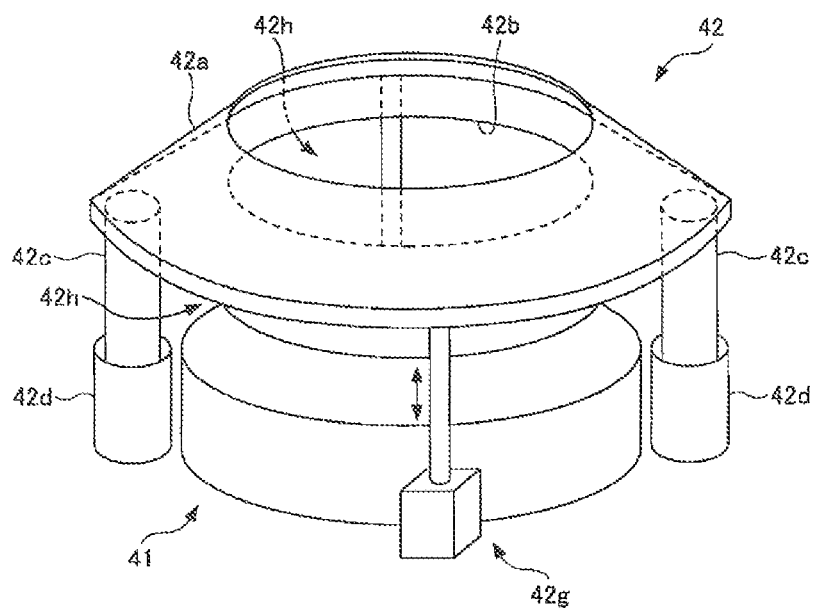

As illustrated in FIG. 2B, a driving mechanism 42g is installed at drying cup 42, so that a vertical position of drying cup 42 is adjusted by the driving mechanism 42g. Specifically, drying cup 42 is located at a position above liquid receiving cup unit 40 by a small gap (see, e.g., FIG. 1, hereinafter, this position is referred to as a lower position), or located at a position separated upwardly from liquid receiving cup unit 40 (see, e.g., FIG. 7, hereinafter, this position is referred to as an upper position). When wafer W is carried-in/out to and from liquid processing apparatus 100, drying cup 42 is disposed at the lower position in order not to be interfered with wafer W.

During drying processing, drying cup 42 is disposed at the upper position, and the outer peripheral edge of wafer W supported by substrate supporting unit 10 is located to be oriented toward opening part P. In this case, a gas flow flowing from the center of wafer W toward the outer periphery is generated around wafer W due to the rotation of wafer W. This gas flow is sucked into duct 42c from opening part P of drying cup 42 through opening h by the exhaust apparatus to be exhausted to exhaust and discharge pipe 42d. The liquid scattered off from wafer W due to the rotation of wafer supporting unit 10 is received in drying cup 42 through opening part P. The received liquid flows on the lower part plate 42b to reach exhaust and discharge pipe 42d through duct 42c from opening h, and only liquid is discharged through a predetermined liquid discharge path (not illustrated) by gas-liquid separator 42f.

During a drying processing in which drying cup 42 is located at the upper position, a gas flow path 42h (see FIG. 2B) is formed communicating inside and outside spaces of liquid receiving cup unit 40 and drying cup 42. An effect by gas flow path 42h will be described later.

In a liquid supplying system of liquid processing apparatus 100, a liquid supplying source 50 is connected to supplying part 20s (a base plate nozzle 20n) through a supplying pipe 57.

The liquid supplying source 50 includes four pipes 51, 52, 53 and 54 in the present embodiment. Various liquid (processing liquid) can be supplied from the pipes. Specifically, SC1 can be supplied from the pipe 52 as a cleaning liquid, CDIW having a room temperature can be supplied from the pipe 51 and HDIW having a high temperature can be supplied from the pipe 53 as a rinsing liquid, and sulfuric acid ($H_2SO_4$) can be supplied from the pipe 54 as a processing liquid for removing the resist.

A collection valve 56 is installed for pipes 51, 52, 53 and 54. The inlet of collection valve 56 is connected to pipes 51, 52, 53 and 54 and the outlet of collection valve 56 is connected to a supply pipe 57. Collection valve 56 has three-way valves corresponding to pipes 51, 52, 53 and 54. Here, the three-way valves are selectively open and closed to supply a desired liquid to supply pipe 57. Specifically, when a three-way valve 51a is open, the CDIW flowing pipe 51 is introduced into supply pipe 57. In the meantime, the liquid having been flown on the corresponding pipes 52, 53 and 54 flows as it is and is not introduced into the supply pipe 57 in the three-way valves having been closed.

Instead of collection valve 56 having the configuration as described above, it may be configured that a plurality of the individual valves are installed at pipes 51, 52, 53 and 54 to selectively supply liquid to the supply pipe 57.

The supply pipe 57 is connected to base plate nozzle 20n of supplying part 20s through a flow rate controller and a supply valve not illustrated. The supply pipe 57 is connected with a drain pipe not illustrated.

In the meantime, ejection port 20m of supplying part 20s ejects oxygenated water ($H_2O_2$) through an opening/closing valve in the present embodiment. Further, top plate nozzle 10n of substrate supporting unit 10 supplies liquid and gas. Since the configuration (pipe and valve etc.) of top plate nozzle 10n is the same as that of base plate nozzle 20n, the description thereof is omitted.

Operation of Liquid Processing

Figure 3:
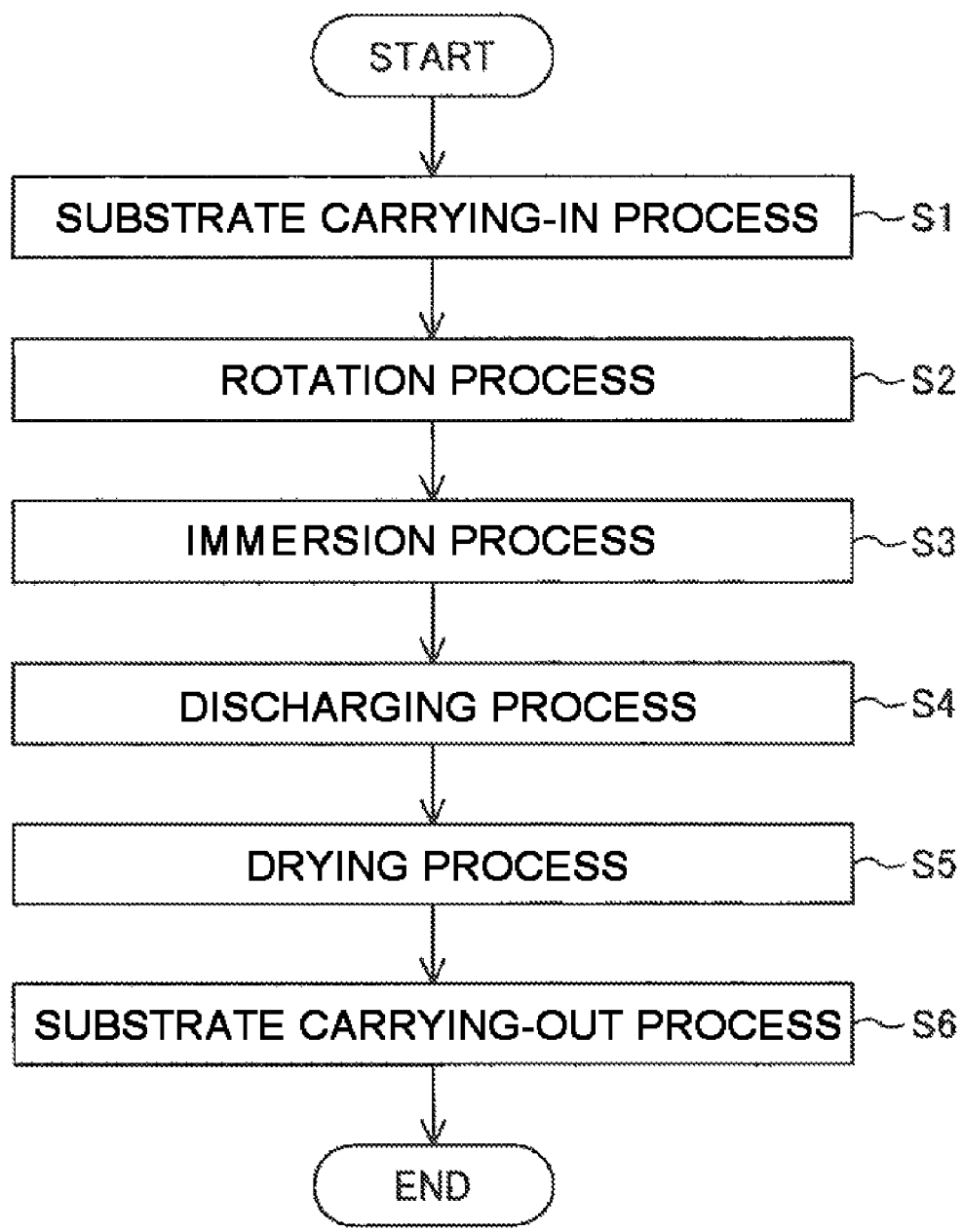
FIG. 3 is a flow chart illustrating a liquid processing method according to an exemplary embodiment of the present disclosure.
Figure 4:
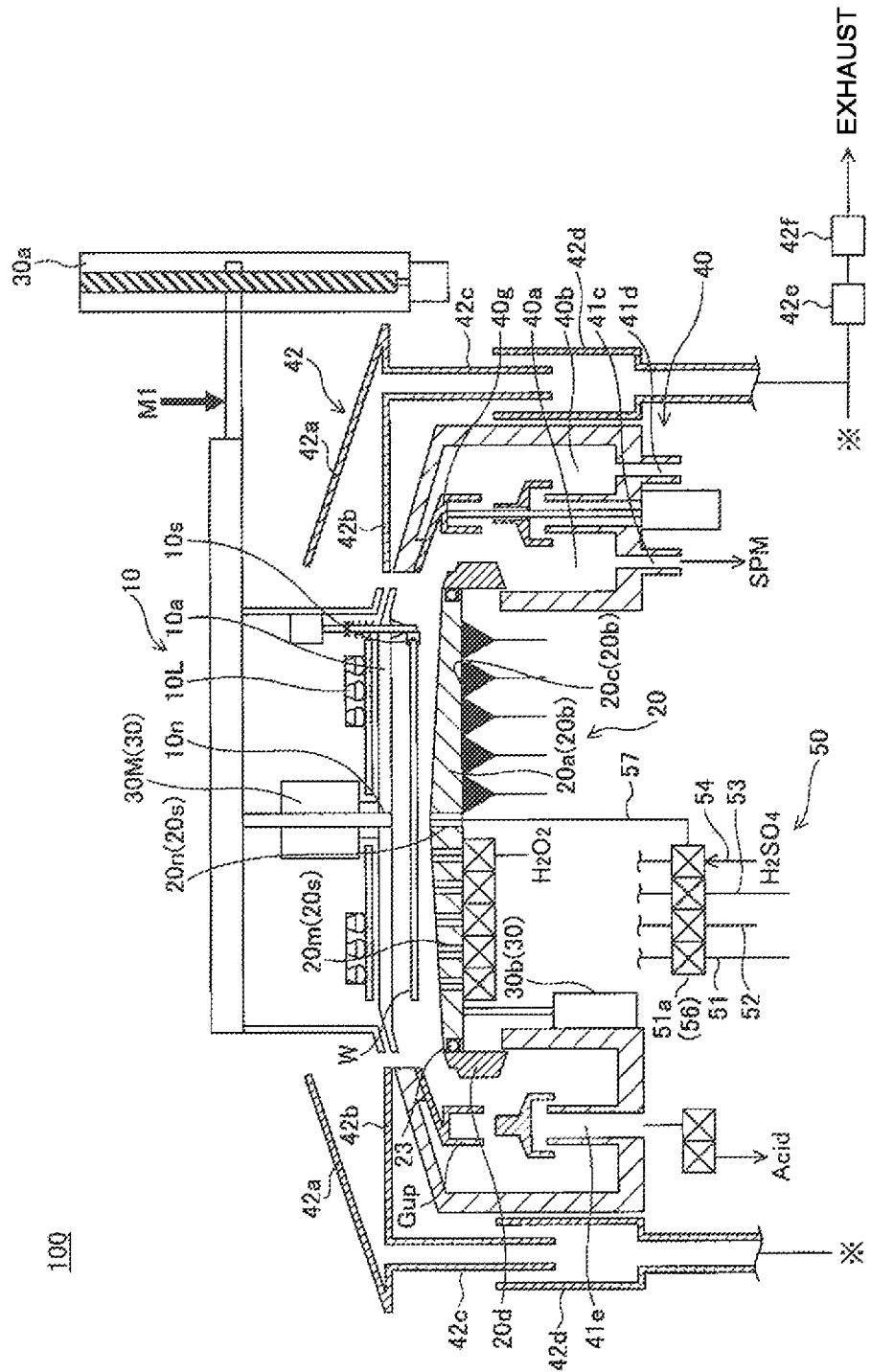
FIG. 4 is an explanatory view illustrating the liquid processing method according to the exemplary embodiment.
Figure 5:
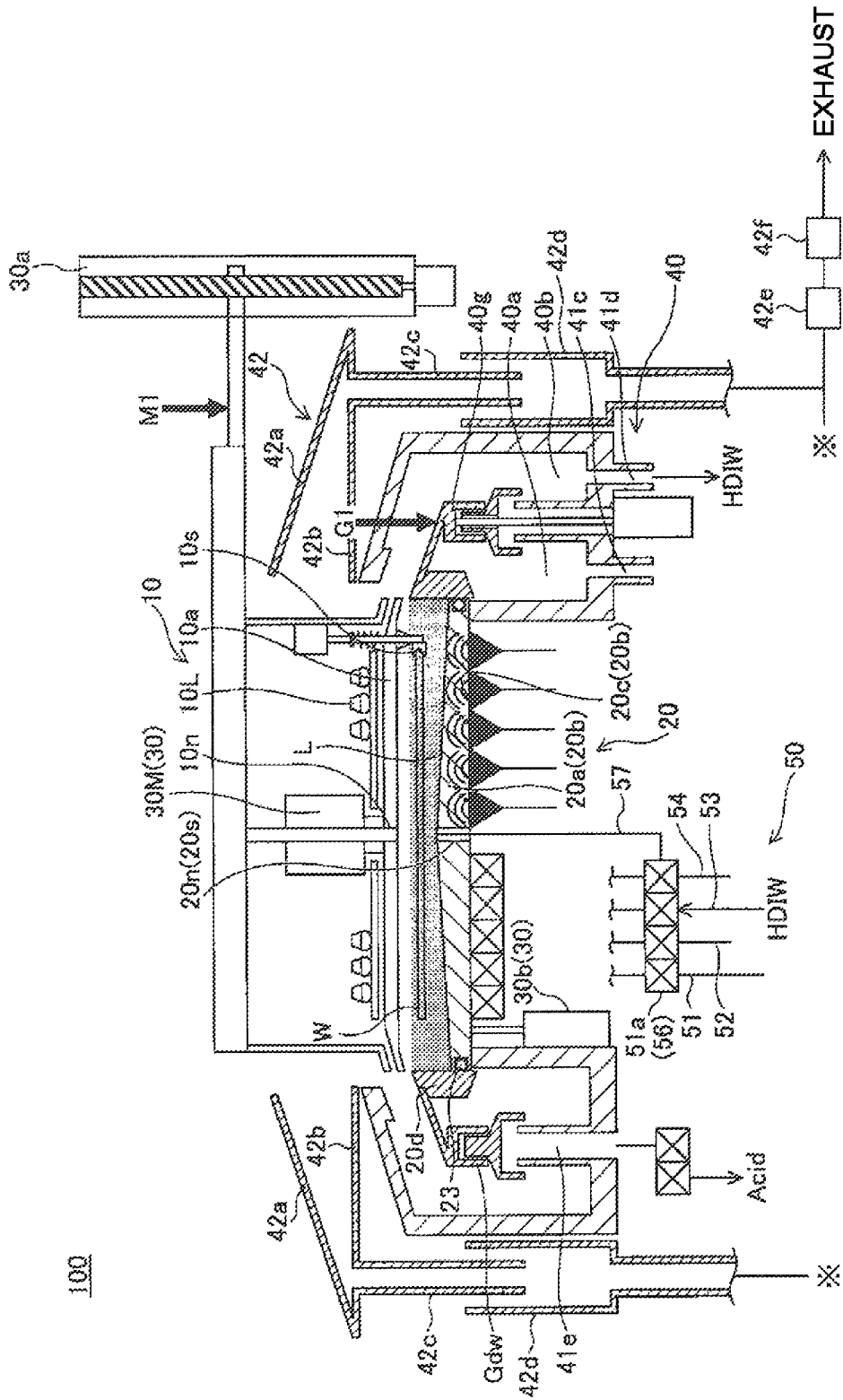
FIG. 5 is an explanatory view illustrating the liquid processing method according to the exemplary embodiment subsequently to FIG. 4.
Figure 6:
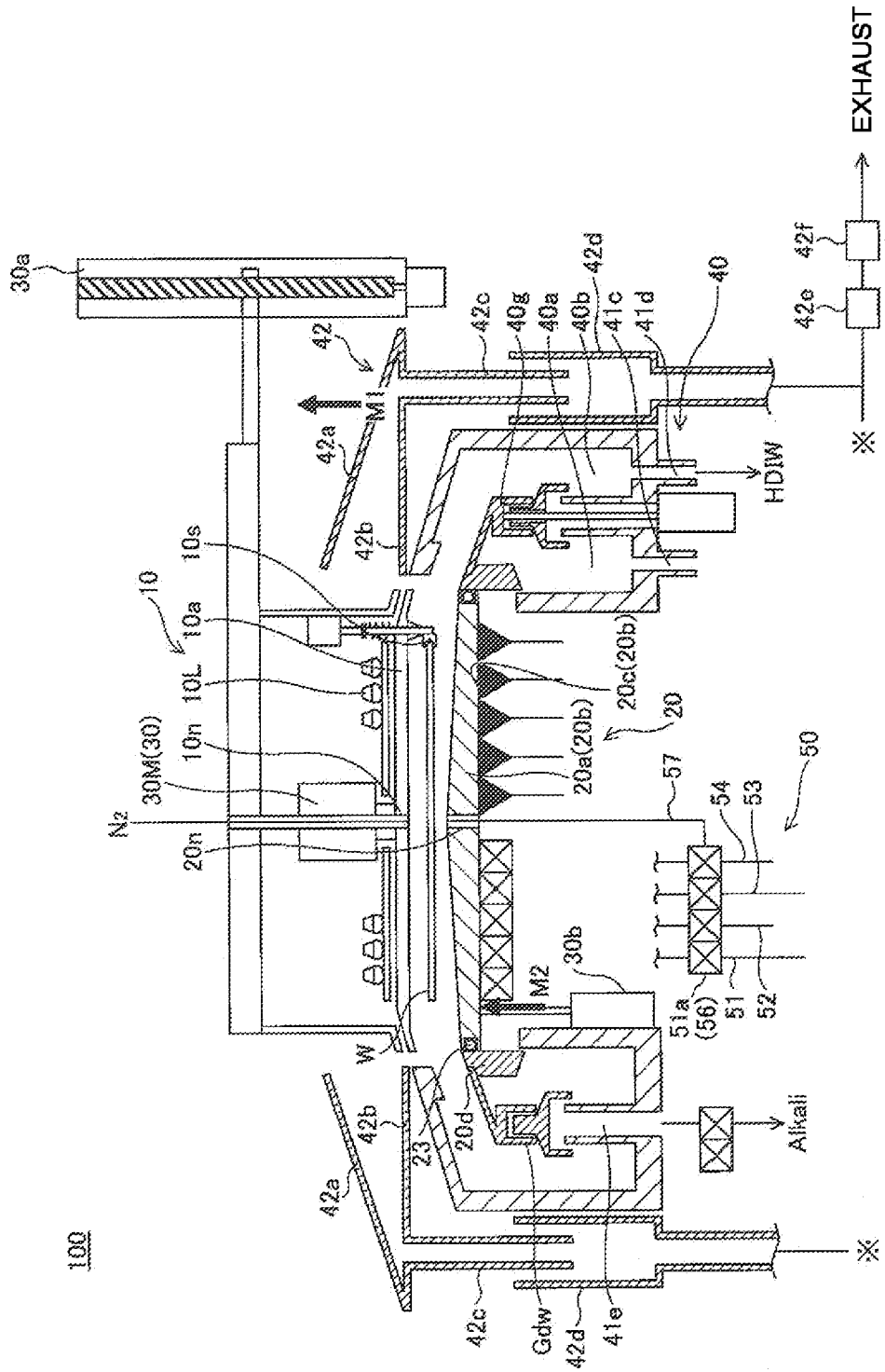
FIG. 6 is an explanatory view illustrating the liquid processing method according to the exemplary embodiment continuously from FIG. 5.

Next, an example of the liquid processing method performed in liquid processing apparatus 100 will be described with reference to FIG. 1 to FIG. 6. FIG. 3 is a flow chart illustrating the liquid processing method. FIG. 4 to FIG. 6 are explanatory views illustrating the respective processes of the liquid processing performed in the liquid processing method. The liquid processing method illustrated in FIG. 3 will be described with reference to FIG. 1 to FIG. 6.

First, at step S1 of FIG. 3 (and FIG. 1), wafer W is carried-into liquid processing apparatus 101) by transfer mechanism 61 (M1 of FIG. 1). Next, wafer W is received from the transfer mechanism 61 by a delivery mechanism (not illustrated) and supported by claw 10s (spin chuck) in substrate supporting unit 10. Substrate supporting unit 10 supports wafer W in a state where the pattern forming surface (the surface to which pattern is formed) of wafer W is oriented downwardly. In this case, drying cup 42 is disposed at the lower position not to be interfered with the transfer mechanism 61. Thereafter, the liquid processing method proceeds to step S2.

In liquid processing apparatus 100, the resist formed on the surface of wafer W is removed at step S2 of FIG. 3 (and FIG. 4) as a rotation processing process. Specifically, in FIG. 4, substrate supporting unit 10 is moved downwardly first (M1) by substrate driving part 30a in liquid processing apparatus 100. In this case, top plate member 10a moved downwardly is located between liquid receiving cup unit 40 and drying cup 42 which is located at the lower position. By doing this, the opening formed above liquid receiving cup unit 40 may be covered. Sectioning guide 40g is located at the upper guide position (Gup).

Next, wafer W (top plate member 10a) is rotated in a predetermined rotation speed (e.g., 500 rpm) by a motor 30M. Thereafter, the three-way valve of pipe 54 is open to eject sulfuric acid ($H_2SO_4$) from base plate nozzle 20n, and oxygenated water ($H_2O_2$) is ejected from ejection port 20m.

In this case, the sulfuric acid is mixed with the oxygenated water and chemical reaction between the sulfuric acid and the oxygenated water ($H_2SO_4+H_2O_2 \rightarrow H_2SO_5+H_2O$) occurs in the mixed liquid to generate the SPM that contains $H_2SO_5$ having a strong oxidizing power. The SPM present on wafer W to which centrifugal force is applied is spread from the center of wafer W toward the outer peripheral portion thereof to form a liquid film of the SPM on the surface of wafer W. Therefore, the oxidation reaction of the SPM removes unnecessary resist left on the surface of wafer W.

The temperature of the liquid film formed with the SPM on the surface of wafer W is decreased as it goes toward the outer periphery of wafer W. Therefore, in liquid processing apparatus 100, heater 10L heats the outer periphery of wafer W to suppress the temperature of the liquid film from being reduced. Further, the SPM present on the surface of wafer W is scattered from the outer peripheral edge of wafer W by the centrifugal force so that the liquid drop of the scattered SPM is recovered by first liquid receiving part 40a of liquid receiving cup unit 40 and discharged to liquid discharging port 41c. Fume such as steam or mist is generated from the high temperature SPM. However, the opening formed above liquid receiving cup unit 40 is covered by top plate member 10a so that it is possible to suppress fume of the SPM from being flown above liquid receiving cup unit 40.

As described above, when the rotation processing process is completed, the rotation of wafer W is stopped, and the liquid processing method proceeds to step S3. Further, in the liquid processing method, the rotation processing process may be omitted such that a processing sequence may proceed from a previous process (step S1) to the next process (step S3).

Next, at step S3 of FIG. 3 (and FIG. 5), the liquid is supplied to storage tank 20 of liquid processing apparatus 100 to be stored. Specifically, sectioning guide 40g is moved downwardly (G1) first to allow the liquid to be discharged to liquid discharging port 41d. Further, a bottom part (base plate member 20a) is lowered by bottom part driving part 30b. The position of an upper end of base plate member 20a is made lower than that of dam part 20d to form storage tank 20 in which the liquid can be stored, together with base plate member 20a and dam part 20d. In this case, drying cup 42 is located at the lower position which is the same position as in the rotation processing process.

Next, a storing process is performed in liquid processing apparatus 100 such that the three-way valve of pipe 53 (or the pipe 51) is open to supply HDIW (or CDIW) to storage tank 20 from base plate nozzle 20n to be stored therein. Subsequently, an immersion process ("a DIP process") is performed in liquid processing apparatus 100 such that substrate supporting unit 10 is moved downwardly (M1) to immerse wafer W into the HDIW (or CDIW) liquid. The DIP process is performed for a predetermined time in liquid processing apparatus 100. In this case, the surface of wafer W can be uniformly cleaned by the DIP process in liquid processing apparatus 100. In this case, the opening formed above liquid receiving cup unit 40 is covered by top plate member 10a so that it is possible to suppress atmospheric gas from being flown to an upper side than liquid receiving cup unit 40.

Here, wafer W (top plate member 10a) may be rotated by motor 30M in a low rotation speed during the DIP process in liquid processing apparatus 100. Vibration may be applied to wafer W by ultrasonic vibration plate 20c to physically ultrasonic-clean the surface of wafer W.

Further, at step S3, liquid may be supplied into storage tank 20 continuously during the DIP process to perform a cleaning wafer W ("an overflow cleaning") while discharging the liquid from the upper end of dam part 20d. In this case, the discharged liquid is received in liquid receiving cup unit 40 (the second liquid receiving part 40b) and then, may be discharged from liquid discharging port 41d in liquid processing apparatus 100. In the overflow cleaning, for example, base plate member 20a to which the liquid (a processing liquid such as the SPM) used at step S2 is adhered can be cleaned concurrently with the cleaning of wafer W. As described above, when the DIP process is completed, the liquid processing method proceeds to step S4.

At step S4 (and FIG. 6), a discharge process is performed in liquid processing apparatus 100 such that liquid is discharged from storage tank 20. Specifically, substrate supporting unit 10 is moved upwardly (M1) first and wafer W is pulled up from the liquid stored in storage tank 20 to be separated in liquid processing apparatus 100. Further, the bottom part (base plate member 20a) is lifted by bottom part driving unit 30b to lift (M2) the surface of the upper end of the bottom part relatively to the surface of the upper end of dam part 20d in liquid processing apparatus 100. By doing this, since the surfaces of the upper ends of base plate member 20a and dam part 20d are inclined planes inclined downwardly in a direction from the central portion of base plate member 20a toward the outer periphery, the liquid in storage tank 20 can be discharged to second receiving part 40b. In the meantime, dam part 20d may be lowered by a dam part driving unit (not illustrated) such that the surface of the upper end of dam part 20d is lowered relatively to the surface of the upper end of the bottom part (base plate member 20a) in liquid processing apparatus 100. Further, after the liquid stored in storage tank 20 is discharged, the liquid present on the surface of wafer W may be removed by rotating wafer W (top plate member 10a) with motor 30M.

As described above, when the discharge processing process is completed, the liquid processing method proceeds to step S5. Further, in the liquid processing method, after the discharge processing process is completed, the liquid processing method may proceed to step S5 when the rotation processing process is completed. As for the rotation processing process, for example, a rotation cleaning process and rinsing process for wafer W may be performed.

Figure 7:
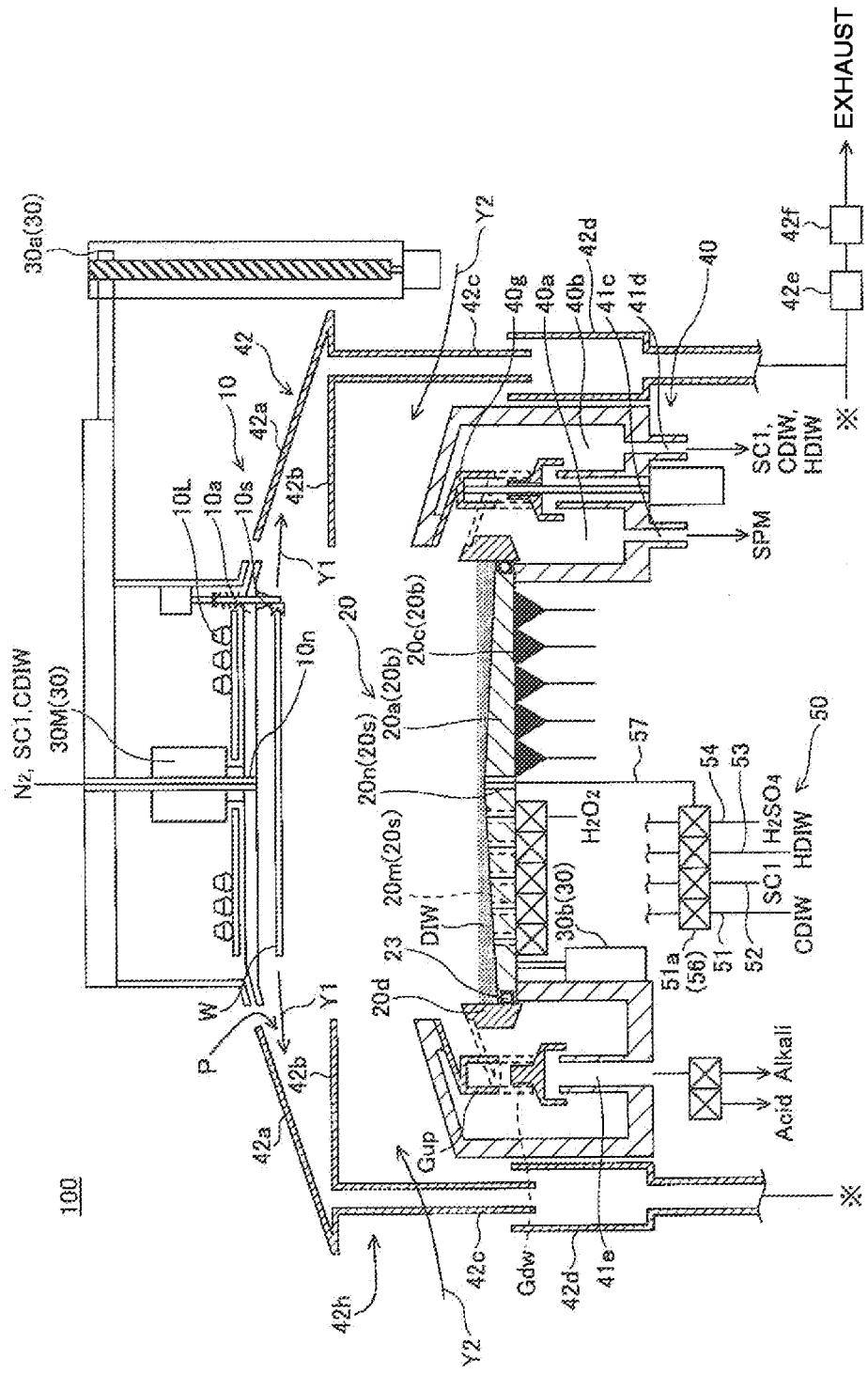
FIG. 7 is an explanatory view illustrating the liquid processing method according to the exemplary embodiment continuously from FIG. 6.

At step S5 of FIG. 3 (and FIG. 7), wafer W is subjected to the drying processing while wafer W is being rotated in liquid processing apparatus 100. Specifically, drying cup 42 is moved to the upper position by the driving mechanism 42g as illustrated in FIG. 7 in synchronized with an upward movement of substrate supporting unit 10 by substrate driving unit 30a. Substrate supporting unit 10 is moved upwardly such that the gas flow path 42h communicating with the inside and outside spaces of liquid receiving cup unit 40 and drying cup 42 is formed therebetween. In this case, the bottom part (base plate member 20a) is lowered by bottom part driving unit 30b to form storage tank 20 and DIW is stored in storage tank 20.

Next, wafer W (top plate member 10a) is rotated by motor 30M. By doing this, DIW remaining on wafer W is scattered by the centrifugal force, thereby drying wafer W. The scattered DIW is introduced into opening part P of drying cup 42 disposed to surround the circumference of wafer W as depicted by the arrow Y1 as illustrated in FIG. 7, and discharged from exhaust and discharge pipe 42d through duct 42c. In this case, in addition to the gas flow at the peripheral portion of wafer W directed from the center to the outer periphery of wafer W, the gas within drying cup 42 is exhausted through exhaust and discharge pipe 42d. By doing this, fume such as steam or mist generated around wafer W is sucked through opening part P, duct 42c and exhaust and discharge pipe 42d. When the gas within drying cup 42 is exhausted, approximately the same amount of clean gas as the exhausted amount can be received therein from a gas flow path 42h formed between drying cup 42 liquid receiving cup unit 40.

As described above, when the drying processing is completed, the rotation of wafer W is stopped, and the liquid processing method proceeds to step S6.

At step S6 of FIG. 3, wafer W is carried-out by transfer mechanism 61 (FIG. 1) outside liquid processing apparatus 100. A carrying-out sequence is the same as the reverse of the carrying-in sequence, and thus, the description thereof is omitted. When the carrying-out is completed, the liquid processing method proceeds to end processing denoted by "END", and the liquid processing operations are completed.

Hereinafter, descriptions will be made for the advantages of liquid processing apparatus 100 and the liquid processing method according to the embodiment of the present disclosure. In the embodiment, the rotation process or the immersion process using liquid can be performed at a different height from the drying processing of wafer W as described above. By doing this, a space for performing the rotation process or immersion process using liquid and a space for drying processing can be separated, and as a result, it is possible to prevent wafer W from being contaminated due to the atmospheric gas remained after the liquid processing. When the liquid processing is performed, the opening of liquid receiving cup unit 40 is covered by top plate member 10a so that it is possible to prevent fume such as steam or mist from being diffused upwardly of liquid receiving cup unit 40. Therefore, fume such as steam or mist generated during the liquid processing is not present at the upper position to which wafer W and drying cup 42 are moved during the drying processing, so that it is possible to prevent particles generated due to adhesion of fume to wafer W during the drying processing.

In liquid processing apparatus 100, when drying cup 42 is located at a position above liquid receiving cup unit 40 by the driving mechanism 42g during the drying processing of wafer W, a large gas flow path 42h is formed between drying cup 42 and liquid receiving cup unit 40. Therefore, a clean gas can be received in a space between wafer W and storage tank 20 through the gas flow path 42h from outside of drying cup 42 (an arrow Y2 of FIG. 7). By doing this, the space between wafer W and storage tank 20 can be maintained at an approximately atmospheric pressure. Further, the drying processing can be performed in a clean atmosphere due to the introduction of the clean gas.

In liquid processing apparatus 100, DIW is stored in storage tank 20 during the drying processing. In the present embodiment, after the rotation processing process using, for example, sulphuric acid or oxygenated water, the immersion process using DIW is performed to remove the chemical liquid present on base plate member 20a by DIW, but there is a concern that the chemical liquid may be remained on base plate member 20a. When the chemical liquid is remained during the drying processing, there is a concern that wafer W may be adversely influenced by the atmospheric gas of the chemical liquid. However, in liquid processing apparatus 100 of the present embodiment, since DIW has been stored above base plate member 20a during the drying processing, the atmospheric gas of the chemical liquid is not generated. Therefore, it is possible to prevent wafer W from being contaminated.

As described above, the present disclosure is described with reference to the exemplary embodiments, but the present disclosure is not limited thereto, and various modifications and changes can be made in view of the claims.

For example, at step S5 (FIG. 7), wafer W may move to the upper position while rotating wafer W (top plate member 10a) with motor 30M. By doing this, removal of DIW from wafer W can be initiated at a faster stage to reduce the time required for the drying processing.

Each of drying cup 42 and top plate member 10a has a driving member, respectively, but drying cup 42 and top plate member 10a may be engaged with each other to be lifted or lowered by a single driving member. By doing this, when top plate member 10a is lifted, drying cup 42 is also lifted so that the circumference of wafer W can be securely covered by drying cup 42.

Further, at step S3 (FIG. 5), DIW may be supplied from base plate nozzle 20n of base plate member 20a toward the lower surface of wafer W and otherwise, DIW may be supplied from top plate nozzle 10n of top plate member 10a toward the upper surface of wafer W. By doing this, both surfaces of wafer W can be cleaned simultaneously.

Drying cup 42 has a tapered cross-sectional shape by the upper plate 42 and lower plate 42b, but not limited thereto, and may have a cross-sectional shape such as, for example, character C shape, or character U shape.

In the present embodiment, drying cup 42 is configured to move vertically, but drying cup 42 may be fixed to a height where the drying processing of wafer W is performed. Also, by doing this, a gas flow path can be formed between the drying cup and the liquid receiving cup, and the clean gas from outside of the drying sup 42 can be received in a space between wafer W and storage tank 20. Without being limited to receipt of clean gas from outside of the drying sup 42, a gas supply part, such as a nozzle may be inserted into a space between the drying cup and the liquid receiving cup to supply gas to the lower surface of wafer W.

The exhausting of gas within the drying sup 42 by exhausting apparatus may be performed constantly, or the exhausting may be operated only during the drying processing. It may be controlled such that gas may be weakly exhausted during the liquid processing, but strongly exhausted during the drying processing.

Further, in the above-described embodiment, a case has been described where the surface of wafer W on which pattern is formed is oriented downwardly, but not limited thereto, and the surface of wafer W on which pattern is formed may be oriented upwardly.

$H_2SO_4$, SC1, and DIW are exemplified as a liquid to be used, but not limited thereto, and a liquid (or gas) according to the liquid processing to be performed may also be used.

In the above-described embodiment, a case where wafer W is subjected to a liquid processing has been described, but the present disclosure can also be applied to a case where the liquid processing is performed for a substrate such as a glass substrate for a flat panel display manufacturing process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a substrate holding unit configured to hold a substrate;
   a rotation driving unit configured to rotate the substrate holding unit;
   a substrate holding unit elevating member configured to lift and lower the substrate holding unit such that the substrate held by the substrate holding unit is located either in a lifted position where the substrate is being dried or in a lowered position where the processing liquid is being supplied;
   a processing liquid supply unit configured to supply a processing liquid to the substrate;
   a liquid receiving cup configured to surround the substrate when the processing liquid is being supplied to the substrate; and
   a drying cup configured to be located above the substrate and the liquid receiving cup when the processing liquid is being supplied to the substrate,
   wherein the drying cup is configured to surround the substrate and be located above the liquid receiving cup when the substrate is being dried,
   the substrate holding unit includes a supporting arm configured to hold the substrate from above such that a surface of the substrate is oriented downwardly facing the processing liquid supply unit while moving between the lifted position and the lowered position, and
   the substrate holding unit includes a nozzle configured to supply the processing liquid to an upper surface of the substrate and move vertically with respect to the drying cup.

2. The liquid processing apparatus of claim 1, wherein the drying cup is located at a higher position when the substrate is being dried than a position when the processing liquid is being supplied.

3. The liquid processing apparatus of claim 1, wherein the drying cup has a ring shape including an upper plate and a lower plate, and an opening part which opens toward a center of the substrate.

4. The liquid processing apparatus of claim 1, wherein the substrate holding unit and the drying cup are lifted synchronously.

5. The liquid processing apparatus of claim 1, further comprising a drying cup elevating member configured to lift and lower the drying cup.

6. The liquid processing apparatus of claim 1, wherein gas is supplied to a lower surface of the substrate when the substrate is being dried.

7. The liquid processing apparatus of claim 1, wherein a gas flow path is provided between the drying cup and the liquid receiving cup for receiving gas outside of the drying cup.

8. The liquid processing apparatus of claim 1, wherein the substrate holding unit is lifted while being rotated.

9. The liquid processing apparatus of claim 1, further comprising a liquid storage unit configured to store liquid so that the substrate can be immersed, and deionized water is stored when the substrate is being dried.

10. The liquid processing apparatus of claim 1, wherein the liquid receiving cup is provided with a liquid discharging port and a gas exhausting port.

11. The liquid processing apparatus of claim 1, wherein the substrate holding unit includes a top plate member and a substrate supporting unit, and
   the top plate member is located between the liquid receiving cup and the drying cup when the processing liquid is supplied to the substrate.

12. The liquid processing apparatus of claim 11, wherein the drying cup is provided with an opening configured to exhaust gas or discharge liquid and the top plate member covers the opening of the drying cup while the substrate is being dried.

13. The liquid processing apparatus of claim 1, wherein the drying cup is provided with an opening configured to exhaust gas or discharge liquid, and the opening is connected with a duct and a lower portion of the duct is inserted into a pipe to be movable vertically forming an exhaust path.

* * * * *